(12) United States Patent
Buist et al.

(10) Patent No.: US 11,705,900 B2
(45) Date of Patent: Jul. 18, 2023

(54) PROTECTION CIRCUITRY

(71) Applicant: Cirrus Logic International Semiconductor Ltd., Edinburgh (GB)

(72) Inventors: Andrew Buist, Edinburgh (GB); Mark McCloy-Stevens, Edinburgh (GB); Dave Smith, Edinburgh (GB); Gordon Russell, Dunfermline (GB); Huy Binh Le, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/159,786

(22) Filed: Jan. 27, 2021

(65) Prior Publication Data

US 2021/0242865 A1   Aug. 5, 2021

Related U.S. Application Data

(60) Provisional application No. 62/968,248, filed on Jan. 31, 2020.

(51) Int. Cl.
*H03K 17/0814* (2006.01)
*H02H 3/18* (2006.01)

(52) U.S. Cl.
CPC ......... *H03K 17/08142* (2013.01); *H02H 3/18* (2013.01)

(58) Field of Classification Search
CPC ....... H03K 17/08142; H02H 3/18; G05F 3/24
See application file for complete search history.

(56) References Cited

U.S. PATENT DOCUMENTS

| | | | | |
|---|---|---|---|---|
| 5,966,038 A * | 10/1999 | Langer | ............ | H03K 19/00315 327/313 |
| 6,008,689 A * | 12/1999 | Au | ....... | H03K 17/162 327/404 |
| 6,353,309 B1 * | 3/2002 | Ootani | ................ | H03K 17/122 323/282 |
| 7,176,665 B2 * | 2/2007 | Knoedgen | ........ | G01R 19/16538 323/282 |
| 7,230,810 B1 * | 6/2007 | Andrews | ............ | H01L 27/0285 361/91.1 |
| 8,130,029 B2 * | 3/2012 | Kinsella | ............... | H03K 17/063 327/543 |
| 2020/0259327 A1 * | 8/2020 | Fahlbusch | ................ | H02H 3/18 |

* cited by examiner

*Primary Examiner* — Ryan Johnson
*Assistant Examiner* — Colleen J O Toole
(74) *Attorney, Agent, or Firm* — Jackson Walker L.L.P.

(57) ABSTRACT

Circuitry for controlling current between a load and a power supply, the circuitry comprising: an output stage comprising: an input node configured to be coupled to the power supply; and an output node configured to be coupled to the load; and one or more control nodes for controlling a conduction path between the input node and the output node; and protection circuitry coupled to the one or more control nodes, the protection circuitry configured to break the conduction path between the input node and the output node when a load voltage at the output node exceeds a supply voltage at the input node, wherein the protection circuitry comprises: an active protection circuit configured to break the conduction path when the supply voltage exceeds an operational threshold of the active protection circuit; and a passive protection circuit configured to break the conduction path when the supply voltage is below an operation threshold of the active protection circuit.

22 Claims, 6 Drawing Sheets

PROTECTION CIRCUITRY

The present disclosure claims priority to U.S. Provisional Patent Application Ser. No. 62/968,248, filed Jan. 31, 2020, which is incorporated by reference herein in its entirety.

TECHNICAL FIELD

The present disclosure relates to circuitry for controlling current, in particular for preventing or reducing reverse current flow in circuitry.

BACKGROUND

Back-powering can occur when a voltage at an output terminal of a circuit is higher than a supply voltage of the circuit, or when an output voltage exists when the supply voltage is powered down or below an operational threshold for the circuit. Such a difference in voltage levels between the voltage at the output terminal and the supply voltage can lead to a reverse current flow through the circuit, which can cause considerable damage to components and printed circuit board (PCB) tracks of the circuit, as well as voltage supply systems supplying the supply voltage to the circuit and other circuits being supplied by the voltage supply systems.

SUMMARY

According to a first aspect of the disclosure, there is provided circuitry for controlling current between a load and a power supply, the circuitry comprising: an output stage comprising: an input node configured to be coupled to the power supply; and an output node configured to be coupled to the load; and one or more control nodes for controlling a conduction path between the input node and the output node; and protection circuitry coupled to the one or more control nodes, the protection circuitry configured to break the conduction path between the input node and the output node when a load voltage at the output node exceeds a supply voltage at the input node, wherein the protection circuitry comprises: an active protection circuit configured to break the conduction path when the supply voltage exceeds an operational threshold of the active protection circuit; and a passive protection circuit configured to break the conduction path when the supply voltage is below an operation threshold of the active protection circuit.

The active protection circuit may comprise a current sensor. The current sensor may be configured to measure a current in the conduction path. The active protection circuit may be configured to control the one or more control nodes based on the measured current. In some embodiments, a sense resistor is provided in the conduction path. The current sensor may be configured to measure the current through the sense resistor.

The active protection circuit may be configured to compare the supply voltage to the load voltage; and control the one or more control nodes based on the comparison. Controlling the one or more control nodes may comprise controlling a gate of the output stage.

The active protection circuit may be configured to control the gate of the output stage when the load voltage exceeds the supply voltage. For example, the active protection circuit may be configured to apply (directly or indirectly) the load voltage at the gate of the output stage when the load voltage exceeds the supply voltage.

In some embodiments, controlling the one or more control nodes comprises controlling a bulk connection between the bulk of the output stage and the input node. For example, the circuitry may further comprise a bulk switch coupled between the bulk of the output stage and the input node. In which, controlling the one or more control nodes may comprise driving a gate of the bulk switch to control the bulk connection between the bulk of the output stage and the input node.

In some embodiments, controlling the bulk connection between the bulk of the output stage and the input node comprises: connecting the bulk of the output stage to the input node when the supply voltage exceeds the load voltage; and disconnecting the bulk of the output stage to the input node when the load voltage exceeds the supply voltage. In some embodiments, the bulk of the output stage may be floated. In other embodiments, the bulk connection between the bulk of the output stage and the input node may be connected to the output node or pulled to the load voltage when the load voltage exceeds the supply voltage.

The active protection circuit may be powered by the supply voltage.

The passive protection circuit may be configured to apply the load voltage to one or more of the one or more control node when the load voltage at the output node exceeds a supply voltage at the input node.

For example, the passive protection circuit may comprise a first gate switch coupled between the control node and the output node. In which case, the first gate switch may be configured to be on when a load voltage at the output node exceeds a supply voltage at the input node by more than a threshold voltage of the first gate switch. In some embodiments, a gate of the first gate switch is coupled to the supply voltage.

In some embodiments, the circuitry further comprises a bulk switch coupled between the bulk of the output stage and the input node. The passive protection circuitry may be configured to apply the load voltage to the gate of the bulk switch when the load voltage at the output node exceeds a supply voltage at the input node.

The passive protection circuit may further comprise: a bulk gate switch coupled between a gate of bulk switch and the output node. The bulk gate switch may be configured to be on when a load voltage at the output node exceeds a supply voltage at the input node, for example by more than a threshold voltage of the first gate switch.

In some embodiments, the circuitry further comprises gate isolation circuitry configured to disconnect the one or more control nodes of the output stage. The gate isolation circuitry may comprise a transmission gate coupled between a gate of the output stage and one or more of the one or more control nodes. A transmission gate switch may also be provided coupled between a gate of the transmission gate and the output node. The transmission gate switch may be configured to turn the transmission gate off when the load voltage exceeds the supply voltage by more than a threshold voltage of the transmission gate switch.

The protection circuitry may further comprise current drain circuitry configured to couple the input node to ground when the load voltage exceeds the supply voltage.

The output stage may comprises a MOSFET device (such as a power MOSFET) for controlling the conduction path between the input node and the output node.

The output stage may comprise first and second power MOSFET devices having a common source. A first drain of the first power MOSFET may be coupled to the input node. A second drain of the second power MOSFET may be coupled to the output node. First and second gates of the first and second power MOSFETs may be coupled to a common one of the one or more control nodes.

The protection circuitry may be coupled to the one or more control nodes via driver circuitry.

The load may comprises a light emitting diode, LED.

According to another aspect of the disclosure, there is provided a circuitry for controlling current between a load and a power supply, the circuitry comprising: an output stage comprising: an input node configured to be coupled to the power supply; an output node configured to be coupled to the load; and a control node for controlling current between the input node and the output node; and protection circuitry configured to apply the supply voltage to the control node when a load voltage at the output node exceeds a supply voltage at the input node.

The protection circuit may comprise a first gate switch coupled between the control node and the output node such that the first gate switch is configured to be on when a load voltage at the output node exceeds a supply voltage at the input node by more than a threshold voltage of the first gate switch.

A gate of the first gate switch may be coupled to the supply voltage.

The circuitry may further comprise a bulk switch coupled between the bulk of the output stage and the input node. The passive protection circuitry may be configured to apply the load voltage to the gate of the bulk switch when the load voltage at the output node exceeds a supply voltage at the input node.

The passive protection circuit may further comprise a bulk gate switch coupled between a gate of bulk switch and the output node. The bulk gate switch may be configured to be on when a load voltage at the output node exceeds a supply voltage at the input node by more than a threshold voltage of the first gate switch.

The circuitry may further comprise gate isolation circuitry configured to isolate the output stage from driver circuitry. The gate isolation circuitry may comprise a transmission gate coupled between the output stage and a driver control node. The transmission gate may have a gate and the circuitry may further comprise a transmission gate switch coupled between the output stage driver control node. The driver control node may be configured for connection to the driver circuitry. The transmission gate switch may be configured to turn the transmission gate off when the load voltage exceeds the supply voltage, for example by more than a threshold voltage of the transmission gate switch.

The protection circuitry may further comprise current drain circuitry configured to couple the input node to ground when the load voltage exceeds the supply voltage.

The supply voltage may be substantially zero volts.

According to another aspect of the disclosure, there is provided an integrated circuit comprising circuitry as described above.

According to another aspect of the disclosure, there is provided an electronic device comprising the integrated circuit defined above. The electronic device may comprise a mobile telephone, a tablet or laptop computer, a wearable device, a gaming device, a virtual reality or augmented reality device.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Figure 1:
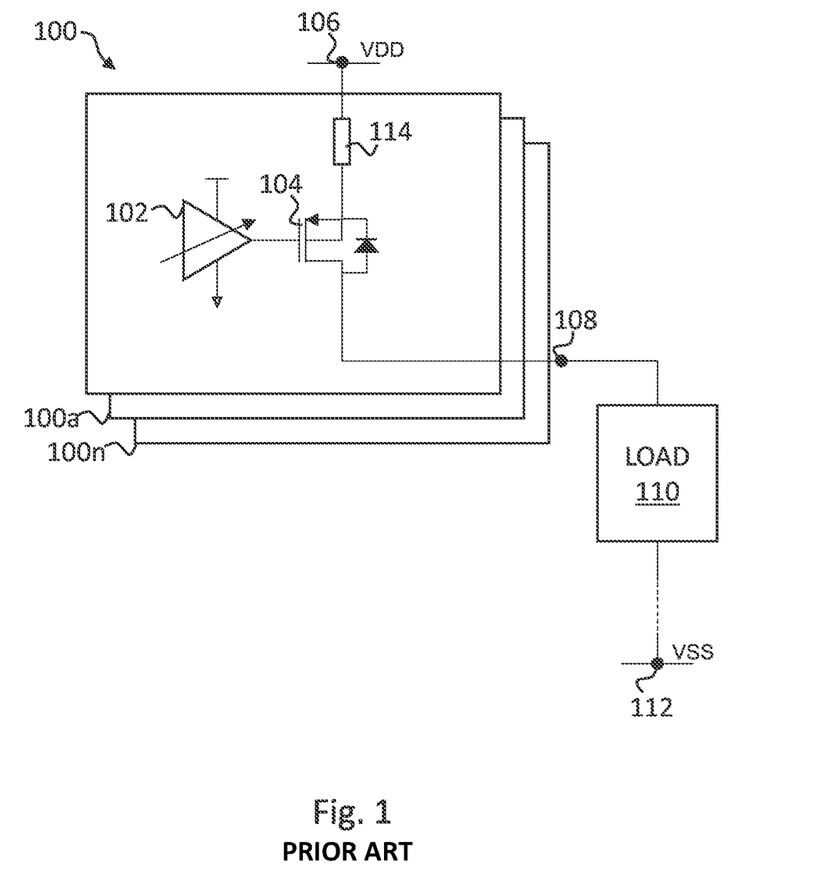
FIG. 1 is a schematic diagram of current control circuitry for controlling current to a load.

Referring to FIG. 1, state-of-the-art current control circuitry is shown generally at 100. The current control circuitry 100 comprises driver circuitry 102 having an output that is coupled to a control (e.g. gate) terminal of an output stage 104, which in the illustrated example is a MOSFET device, such as a power MOSFET. A conducting path of the output stage 104 (in the illustrated example between the source and drain of the MOSFET device) is coupled between a supply node 106 providing a supply voltage VDD and an output node 108.

A load 110 may be coupled to the output node 108, and driven by the current supplied to the output node 108 via the output stage 104. The load 110 may comprise, for example, a current-driven transducer or an array of such transducers. For example, the load 110 may comprise an ultrasonic transducer or array of ultrasonic transducers, an LED or array of LEDs, or some other current-drive transducer or array of current-driven transducers. The load 110 may also be coupled to a voltage node 112 which may be at ground or a reference voltage VSS. The load 110 may be coupled to the voltage node 112 via additional components, such as switching components (not shown). The voltage node 112 may therefore act as a current sink. In some embodiments, the load 110 may be coupled to additional voltage nodes similar to the voltage node 112. The load 110 may be coupled to each additional voltage node via additional components, such as switching components. Thus, the load 112 may be selectively coupled to the voltage node 112 and/or any of the additional voltage nodes.

The output stage 104 can be actuated in response to a control signal provided by the driver circuitry 102 so as to selectively couple the supply node 106 to the output node 108. Optionally, the current control circuitry 100 may further comprise a current sense resistor 114 which may be used to measure current flow between the supply node 106 and the output node 108, for example by measuring a voltage drop across the sense resistor 114. In the embodiment shown, the sense resistor 114 is provided between the output stage 104 and the supply node 106. In alternative embodiments, the sense resistor 114 may be provided between the output stage 104 and the output node 108. In other embodiments, the sense resistor 114 may be omitted and the output stage 104 coupled directly to the supply node 106.

Thus the current control circuitry 100 is configured to control current flow between the supply node 106 and the output node 108. The current control circuitry 100 may be part of a system comprising additional current control circuits 100a:100n, each current control circuit 100, 100a:100n selectively controlling current to a respective load.

In normal operation, the voltage at the output node 108 is lower than the supply voltage VDD at the supply node 106 such that current flows from the supply node 106 to the output node 108 and through the load 110 to the voltage node 112. However, in some situations back-powering can occur, for example when a voltage at the output node 108 is higher than the voltage VDD at the supply node 106, or when the supply voltage VDD is powered down or below an operational threshold. Such a back-power condition can lead to a reverse current flow from the output node 108 through the output stage 104 to the supply node 106. Reverse current flow can cause considerable damage to components of the circuitry 100 as well as any circuitry coupled to the supply node 106, such as voltage supply systems or other components coupled to and/or being supplied by the supply voltage VDD (each not shown). Additionally, reverse current flow can cause damage to traces on the printed circuit board (PCB). This problem is exacerbated when the impedance of the conduction path between the supply node 106 and the output node 108 is very low, i.e. when the output stage 104 is switched on. In such cases, a small negative voltage differential between the supply node 106 and the output node 108 can lead to a relatively large current flowing through the output stage 104 to the output node 108.

Figure 2A:
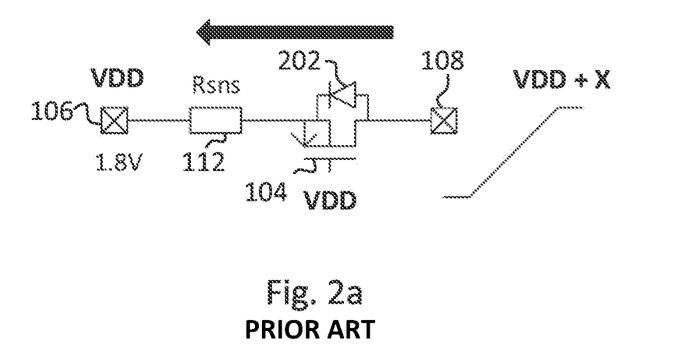
FIGS. 2a, 2b and 2c illustrate back-power conditions in the current control circuitry of FIG. 1.
Figure 2B:
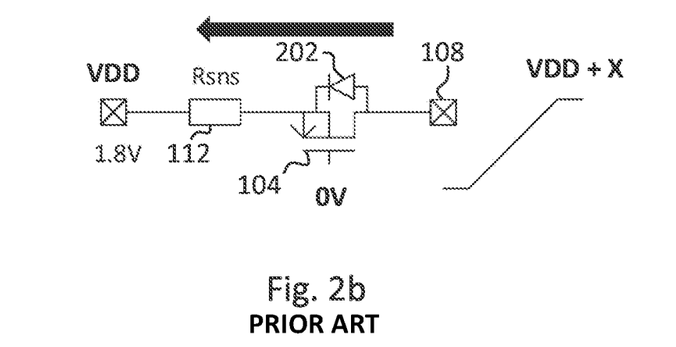
Figure 2C:
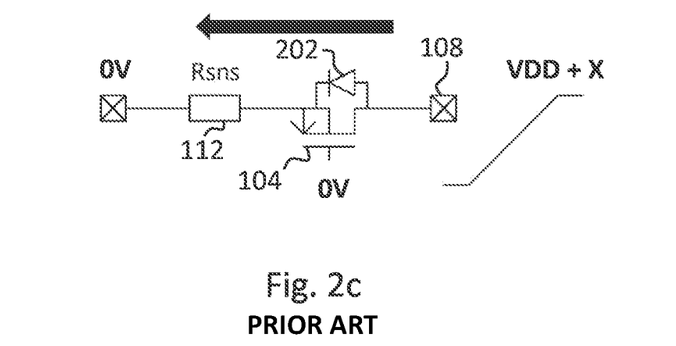

FIGS. 2a, 2b and 2c each show a simplified diagram of the current control circuitry 100 of FIG. 1 under different back-power conditions. In this example, the output stage 104 comprises a power MOSFET device. A parasitic diode 202 inherent to the power MOSFET is shown in each of FIGS. 2a to 2c to aid explanation of the effect of each back-power condition.

FIG. 2a shows a back-power condition in which the supply voltage VDD at the supply node 106 is present and above an operational threshold for the circuitry 100, and the output stage 104 is switched off by application of the supply voltage VDD at the gate of the output stage 104. However, when the voltage at the output node 108 exceeds VDD+Vd where Vd is the finite voltage drop across the parasitic diode 202, a reverse current flows through the parasitic diode 202 of the output stage 104. In addition, when the voltage at the output node 108 exceeds VDD+Vt, where Vt is the threshold voltage of the MOSFET of the output stage 104, the output stage 104 will turn on causing reverse current to flow through the MOSFET device itself.

FIG. 2b shows another back-power condition in which the supply voltage VDD at the supply node 106 is present and above an operational threshold for the circuitry 100 and the output stage 104 is switched on with a gate voltage at the gate of the output stage 104 of zero volts. Thus, a low impedance path is present between the output node 108 and the supply node 106. In this condition, when the voltage at the output node 108 exceeds the supply voltage VDD, current will flow from the output node 108 to the supply node 106 via the output stage 104. Due to the low impedance of the output stage 104 in this condition, a small differential in voltage between the output node 108 and the supply node 106 can lead to a relatively large reverse current through the output stage 104.

FIG. 2c shows a back-power condition in which the supply voltage VDD is either not present at the supply node 106 or below an operational threshold of the circuitry 100. Such a condition provides a particular challenge with respect to back-power reduction, since the circuitry 100 is not operational and any circuitry provided to reduce or prevent a back-power condition from occurring cannot rely on power supplied by the supply voltage VDD, for example via the supply node 106.

As with the example in FIG. 2b, in this example zero volts is provided at the gate of the output stage 104. As such, the MOSFET device of the output stage 104 is switched on when the voltage at the output node 108 exceeds the threshold voltage Vt of the MOSFET device allowing reverse current to flow through the MOSFET device. In addition, current will be conducted through the parasitic diode 202 when the voltage at the output node exceeds the voltage drop, Vd, across the diode, providing an additional conduction path for reverse current flow from the output node 108 to the supply node 106.

Each of the back-power conditions described above are further exacerbated by the fact that the bulk of the output stage 104 is conventionally connected to the source, thus providing an additional conduction path for reverse current.

Embodiments of the present disclosure aim to prevent or at least reduce the likelihood of a back-power condition from occurring, or reduce the severity of a back-power condition in the instance that one does occur.

Embodiments of the present disclosure aim to address or at least ameliorate one or more of the above issues. For example, embodiments of the present disclosure may provide protection circuitry for controlling one or more control nodes of the output stage 104 so as to break any conduction path between the supply node 106 and the output node 108 on detection of a back-power condition. For example, embodiments of the present disclosure may provide circuitry for selectively switching a bulk or body of the output stage 104 between one or more nodes of the circuitry 100. For example, embodiments of the present disclosure may provide passive protection circuitry operable to prevent or reduce reverse current between the output node 108 and the supply node 106 when the supply voltage VDD at the supply node is below an operational threshold voltage of the circuitry 100, such an operational threshold voltage required for the operation of active circuitry (e.g. amplifiers, drivers etc.).

Figure 3:
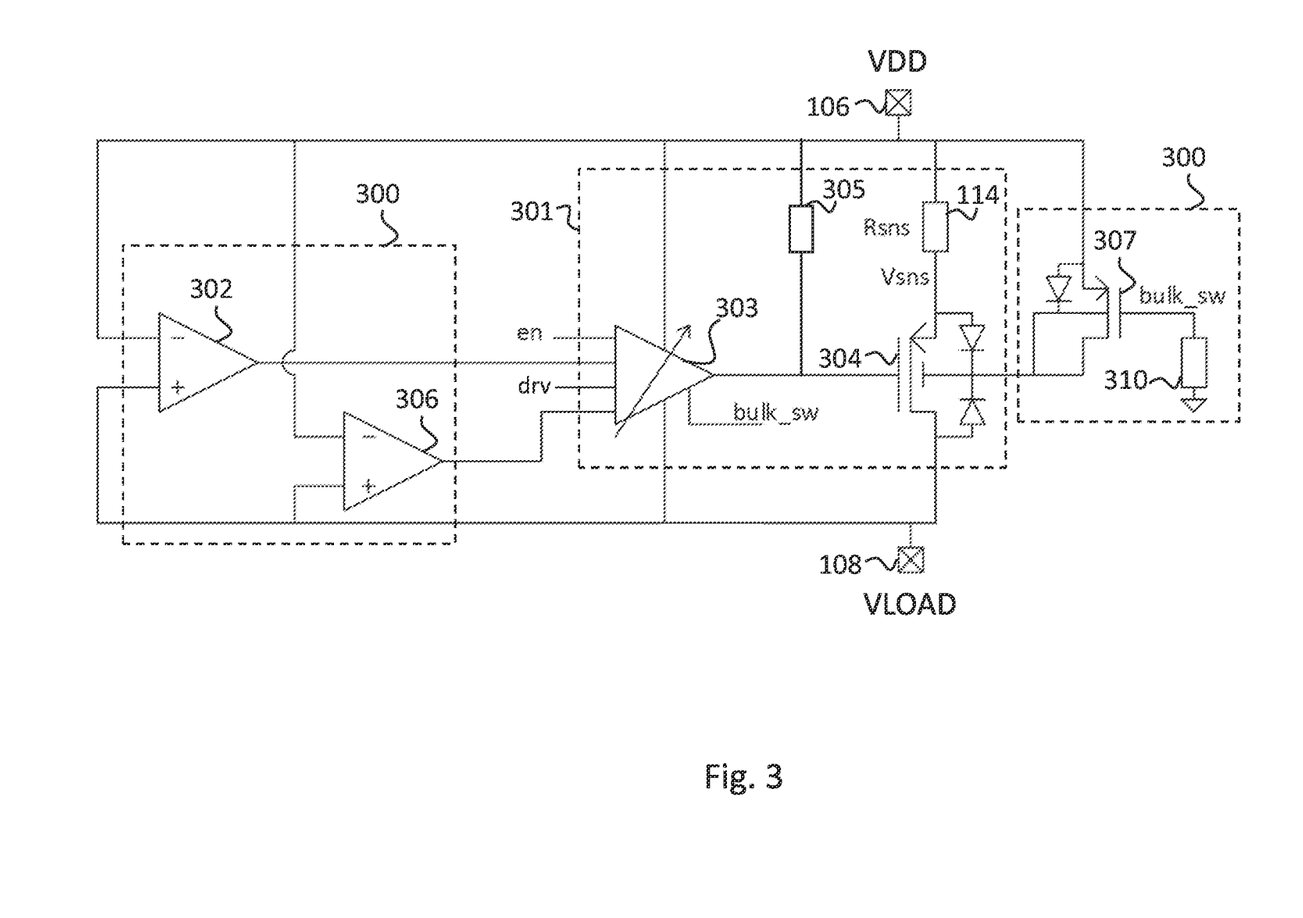
FIG. 3 is a schematic diagram of back-power protection circuitry according to embodiments of the present disclosure.

FIG. 3 is a schematic diagram showing exemplary back-power protection circuitry 300 according to embodiments of the present disclosure. The protection circuitry is provided to prevent or at least reduce reverse current flow through control circuitry 301. It will be appreciated that the current control circuitry 301 in FIG. 3 is similar to that shown in FIG. 1 and like numerals denote like parts where appropriate.

As with the circuitry 100 of FIG. 1, the current control circuitry 301 comprises driver circuitry 303 having an output coupled to a control terminal (e.g. gate) of an output stage 304. In this example, the output stage 304 comprises a MOSFET device. It will be appreciated that in other embodiments, different switching devices and/or different configurations of switching devices may be used.

The output stage 304 is coupled between supply node 106 and the output node 108, optionally via the sense resistor 114 as described with reference to the circuitry 100 of FIG. 1. The driver circuitry 303 is configured to receive one or more control inputs and output a control signal to the output stage 304. The one or more control inputs of the driver circuitry 303 may comprise one or more of an enable input, en, for enabling the driver circuitry 303 and a driver input, drv, configured to control the driver circuitry 303 during normal operation (i.e. in a non-back-power condition). In this embodiment, the gate of the output stage 304 is coupled to the supply node 106 by an optional pullup resistor 305 such that the gate is pulled to VDD and the output stage 304 is switched on when a supply voltage is present and no other control voltages are applied at the gate of the output stage 304 (e.g. by the driver circuitry 303). The pullup resistor 305 may have a high enough resistance so as to limit leakage current flowing between the gate of the output stage 304 and the supply node 106 which would otherwise consume power.

The back-power protection circuitry 300 comprises an active protection circuit 302 and a passive protection circuit 306. Optionally, the back-power protection circuit also comprises a bulk switch 307. In this embodiment, the active protection circuit 302 and the passive protection circuit 306 may output a control signal to the driver circuitry 303. Alternatively, however, one or more of the active protection circuit 302 and the passive protection circuit 306 may control the output stage 304 directly, bypassing the driver circuitry 303. As such, in some embodiments, the driver circuitry 303 may be omitted altogether.

As noted above, the connection between the bulk and the source of the conventional output stage 104 of FIG. 1 described above is provided with a conduction path through which reverse current can flow during a back-power condition. To reduce or prevent such current flow, in contrast to the output stage 104 of FIG. 1, connection to the bulk or body of the output stage 304 is preferably switchable between one or more nodes, such as the supply node 106, the output node 108 and/or to a floating state in which the bulk of the output stage 304 is not connected to any node. In the example shown, the bulk switch 307 provides such functionality.

The bulk switch 307 is coupled between a bulk terminal of the output stage 304 and the supply node 106. A gate of the bulk switch 307 is configured to receive one or more control signals, for example from the driver circuitry 303 or the active protection circuit 302. In the embodiment shown, the bulk switch 307 is implemented as a p-type MOSFET device. As such, the gate of the bulk switch 307 may be coupled to a ground reference voltage via a bulk resistor 310, i.e. pulled low such that by default the bulk switch 307 is closed (on), shorting and thus allowing current to flow between the bulk of the output stage 304 and the supply node 106. The gate of the bulk switch 307 may then be pulled high by one or more control signals applied at the gate to turn the bulk switch 307 off thus disconnecting the bulk of the output stage 304 and the supply node 106.

The active protection circuit 302 is configured to control the output stage 304 (and optionally the bulk switch 307) to substantially break or remove any conduction paths between the supply node 106 and the output node 108. The active protection circuit 302 may be operational when the supply voltage is at or above a operational threshold voltage, e.g. a supply voltage is provided which exceeds an operating voltage of the active protection circuit 302. Whilst not shown in FIG. 3, the active protection circuit 302 is preferably powered by the supply voltage VDD, for example via the supply node 106, such that the active protection circuit 302 does not require external power.

The active protection circuit 302 may be configured to determine that a back-power condition is present which could cause a reverse current to flow from the output node 108 to the supply node 106. A back-power condition may exist, for example, if load voltage at the output node 108 exceeds the supply voltage VDD at the supply node 106. As such, the active protection circuit 302 may be configured to compare the supply voltage VDD at the supply node 106 with a load voltage VLOAD at the output node 108 to determine whether a back-power condition exists. Such comparison may be performed by a comparator.

In other embodiments, the active protection circuit may comprise a current sensor configured to detect a reverse current flowing from the output node 108 to the supply node 106. For example, the current sensor may detect a voltage drop across the sense resistor 114 and determine a current flow, such as a forward or reverse current flow based on the detected voltage drop.

The active protection circuit 302 may then output a control signal based on a determined back-power condition, for example based on the comparison between the load voltage VLOAD and the supply voltage VDD or based on the detected voltage drop across the sense resistor 114.

As noted above, the control signal or signals from the active protection circuit 302 may be provided to the driver circuitry 303 or directly to the output stage 304 and/or the bulk switch 307. Where the active protection circuit 302 provides the control signal directly to the output stage 304, the output of the driver circuitry 303 may be tri-stated.

The passive protection circuit 306 is configured to operate to prevent reverse current flow during a back-power condition when the supply voltage is zero, substantially zero or when the supply voltage is below an operating voltage for the active protection circuit 302. Thus the passive protection circuit 306 may be configured to operate without an external power source (such as the supply voltage VDD). For example, the passive protection circuit 306 may be configured to operate using the load voltage VLOAD present at the output node 108 during a back-power condition.

The passive protection circuit 306 may be configured to break the conduction path between the supply node 106 and the output node 108. Additionally or alternatively, the passive protection circuit 306 may be configured to turn the bulk switch 307 off so as to float the bulk of the output stage 304, thus removing the conduction path between the bulk and the supply node 106.

Like the active protection circuit 302, the passive protection circuit 306 is configured to provide one or more control signals to the driver circuitry 303, the output stage 304 and/or the bulk switch 307 to control the conduction path or paths between the supply node 106 and the output node 108. For example, the passive protection circuit 306 may be configured to pull the gate voltage at the output stage 304 to the higher of either the supply voltage VDD and the load voltage VLOAD at the output node 108 to prevent the output stage 304 from switching on. The passive protection circuit 306 may achieve this by routing the load voltage VLOAD to the gate of the output stage 304 when the load voltage VLOAD exceeds the supply voltage VDD, for example by a threshold amount.

By providing the combination of the active protection circuit 302 and the passive protection circuit 306, the back-power circuitry 300 is able to operate in reducing or preventing reverse current flow from the output node in substantially all back-power conditions without the need for an external or third-party power source.

The operation of the back-power protection circuitry 300 in various back-power conditions will now be described with reference to FIGS. 4a, 4b and 4c.

Figure 4A:
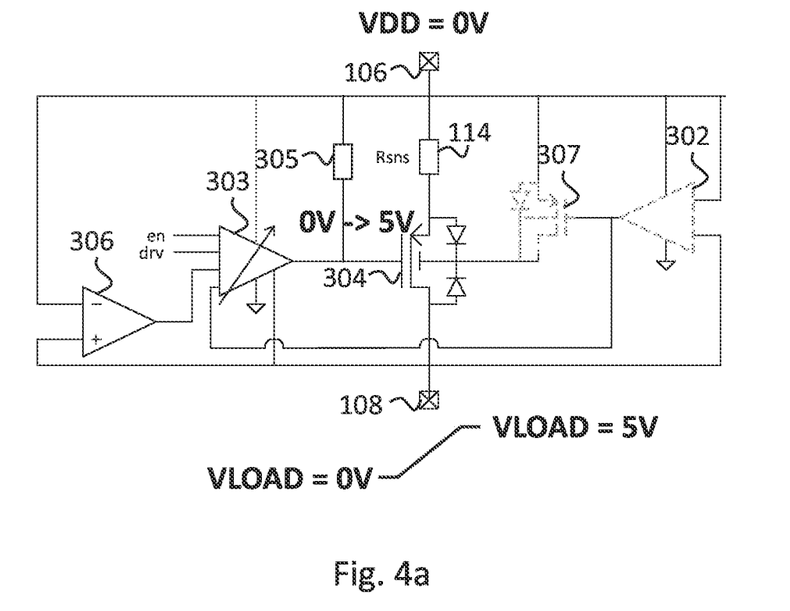
FIGS. 4a, 4b and 4c illustrate the operation of the back-power circuitry shown in FIG. 3 under various back-power conditions.

Referring to FIG. 4a, when the supply voltage VDD is below an operational threshold for the active protection circuit 302 (and the driver circuitry 303), the active protection circuit 302 is not operational and so is unable to provide a control signal to either the output stage 304 or the bulk switch 307. However, the passive protection circuit 306 is operational and is configured to pull the gate of the output stage 304 to the higher of the supply voltage VDD and the load voltage VLOAD. Thus, when the load voltage VLOAD applied at the output node 108 exceeds the supply voltage VDD, the passive protection circuit 306 pulls the gate of the output stage 304 to the level of the load voltage VLOAD for example by connecting the output node 108 to the gate of the output stage 304. In doing so, the voltage at the gate of the output stage 304 is maintained at VLOAD and thus within a threshold voltage Vt of the load voltage. Thus the output stage 304 is maintained in an off state so as to prevent reverse current flow from the output node 108 to the supply node 106 through the output stage 304.

Similarly, the passive protection circuit 306 may be configured to pull the gate of the bulk switch 307 to the higher of the supply voltage VDD and the load voltage VLOAD. Thus, when a load voltage VLOAD applied at the output node 108 exceeds the supply voltage VDD, the passive protection circuit 306 pulls the gate of the bulk switch to the load voltage VLOAD. As such, the bulk switch 307 is switched off (open circuit) and the bulk of the output stage 304 is thus disconnected from the supply node 106.

The passive protection circuit 306 therefore operates to isolate the output node 108 from the supply node 106 to prevent reverse current flow from the output node 108 to the supply node 106 through the output stage 304.

Figure 4B:
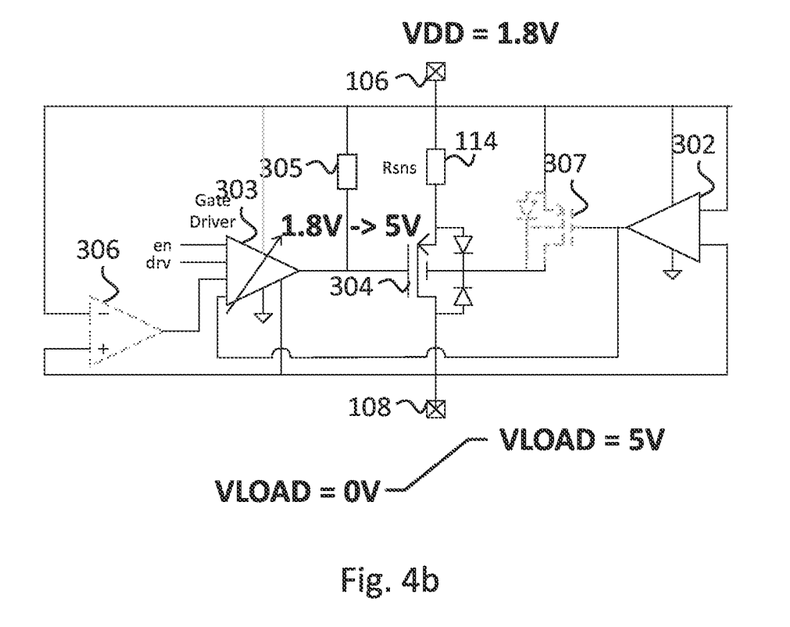
Figure 4C:
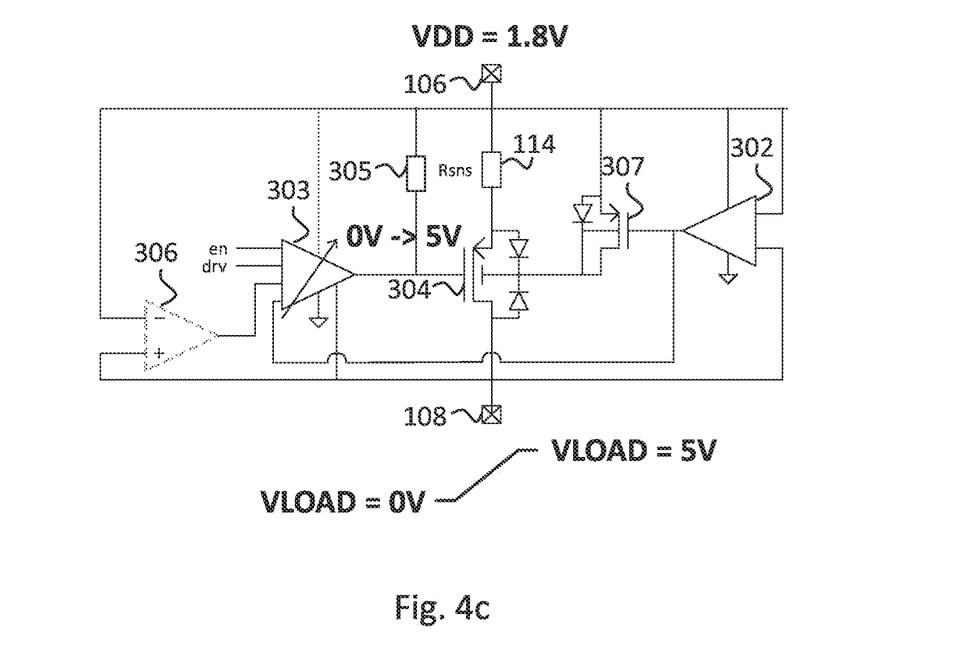

FIGS. 4b and 4c illustrate back-power conditions in which the supply voltage VDD is present and at or above an operational threshold of the active protection circuit 302. In such circumstances, the active protection circuit 302 has sufficient power to be operational and is configured to control the gate of the output stage 304 in dependence on the supply voltage VDD and the load voltage VLOAD. Specifically, when the supply voltage VDD is greater than the load voltage VLOAD at the output node 108, the active protection circuit 302 may not actively control the gate of the output stage 304. In this situation, the driver circuitry 303 may be configured to control the output stage 304 in accordance with normal operation of the current control circuitry 301. Since the driver circuitry 303 is powered by the supply voltage VDD, the upper range of the control signal applied to the gate of the output stage will be VDD. By default, the gate bulk switch 307 is pulled low by the bulk resistor 310 such that the bulk switch 307 is closed and the bulk of the output stage 304 is connected to the supply voltage VDD. This reduces the threshold of the output stage 304 as well as ensuring that the parasitic diode of the output stage 304 connected at the output node 108 is reverse biased.

When a back-power condition occurs in which the load voltage VLOAD at the output node 108 exceeds the supply voltage VDD, the active protection circuit 302 is configured to drive the gate of the output stage 304 with the load voltage VLOAD present at the output node 108.

As shown in FIG. 4b, if prior to the back-power condition the output stage 304 was turned off by the driver circuitry 303 driving the gate with the supply voltage VDD, by driving the gate of the output stage 304 with the load voltage VLOAD, the output stage 304 is prevented from switching on in the presence of back-powering at the load voltage VLOAD at the output node 108. The active protection circuit 302 may also set the bulk switch 307 to float the bulk of the output stage 304 so as to remove the conduction path between the bulk of the output stage 304 and the supply node 106. Additionally, the active protection circuit 302 may be configured to connect the bulk of the output stage 304 to the output node 108.

As shown in FIG. 4c, if prior to the back-power condition the output stage 304 was turned on by the driver circuitry 303, by driving the gate of the output stage 304 with the load voltage VLOAD, the output stage 304 is turned off, breaking the conduction path through the output stage 304 between the supply node 106 and the output node 108. The active protection circuit 302 may also set the bulk switch 307 to float the bulk of the output stage 304 so as to remove the conduction path between the bulk of the output stage 304 and the supply node 106. Additionally, the active protection circuit 302 may be configured to connect the bulk of the output stage 304 to the output node 108.

The active protection circuit 302 therefore operates to isolate the output node 108 from the supply node 106 to prevent reverse current flow from the output node 108 to the supply node 106 when the supply voltage exceeds the operational voltage of the active protection circuit 302.

It is noted that in the conditions shown in FIGS. 4b and 4c, the passive protection circuit 306 may, additionally or as an alternative to the active protection circuit 302, be configured to control the gate of the output stage 304 and/or the gate of the bulk switch 307 in a similar manner to that described above with reference to FIG. 4a.

It is also noted that in other embodiments, instead of floating the bulk of the output stage 304, the active protection circuit 302 and/or the passive protection circuit 306 may be configured to pull the bulk of the output stage 304 to the load voltage VLOAD at the output node 108.

Figure 5:
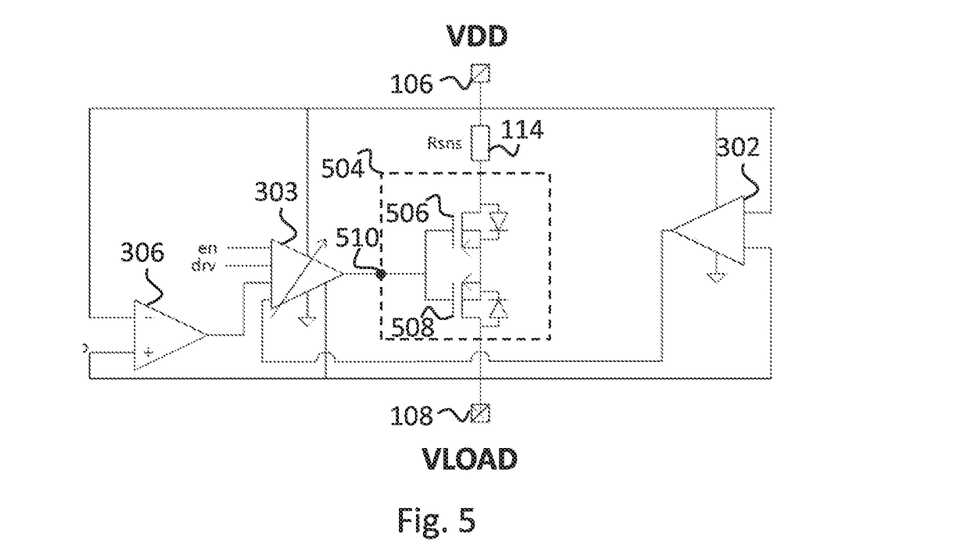
FIG. 5 is a schematic diagram of a variation of an output stage of the back-power circuitry shown in FIG. 3.

FIG. 5 is a schematic diagram of a variation of the circuitry described with reference to FIGS. 3, 4a, 4b and 4c, where like parts have been given like numbering. The embodiment in FIG. 5 differs from that shown in FIG. 3 in that the output stage 304 has been replaced with an output stage 504 comprising a pair of MOSFET switches 506, 508, provided in a back-to-back switching arrangement. The sources of MOSFET switches 506, 508 are connected to one another. The drains of the MOSFET switches 506, 508 are coupled to the supply node 106 (via the optional sense resistor 114) and the output node 108, respectively. The gates of the MOSFET switches 506, 508 are connected together at a common control node 510. Like the output stage 304, the output stage 504 operates as a switch in response to a control signal, in this case at the common control node 510. However, the arrangement removes the need for bulk connections between a bulk of the output stage 504 and the supply voltage VDD due to the back-to-back configuration.

The structure and operation of the passive protection circuit 306 according to some embodiments of the present disclosure will now be described with reference to FIG. 6 which shows a circuit diagram of the passive protection circuit 306 which is able to control the conduction path between the output node 108 and the supply node 106 when the supply voltage VDD is below an operational voltage of the active protection circuit 302 and the driver circuitry 303. It will be appreciated that the passive protection circuit 306 can also control the conduction path when the supply voltage VDD is able such an operational voltage.

Figure 6:
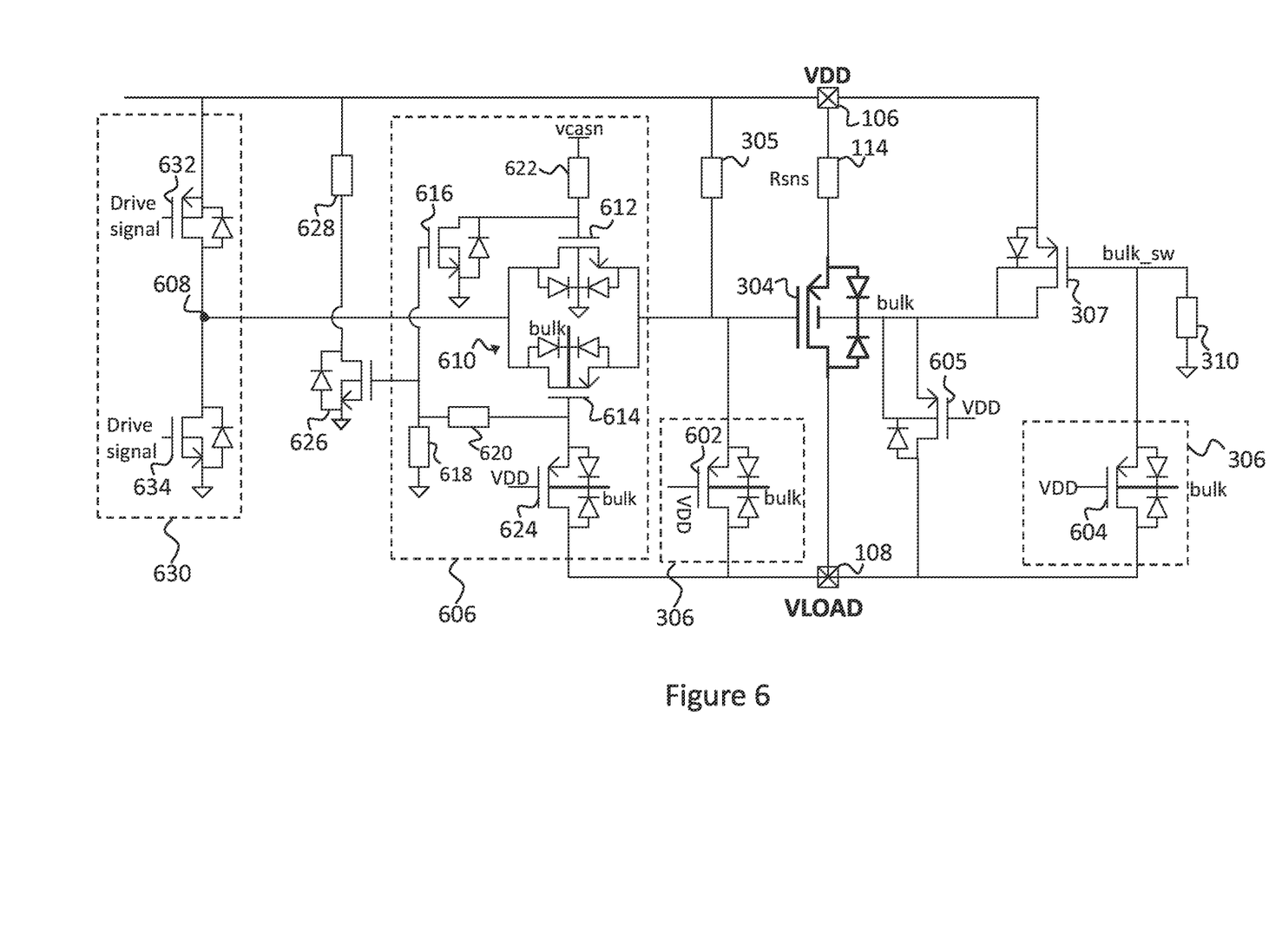
FIG. 6 is a schematic diagram of passive back-power prevention circuitry according to embodiments of the present disclosure.

For clarity, the active protection circuitry 302 and the driver circuitry 303 have been omitted from FIG. 6. Additionally, the passive protection circuit 306 is shown in FIG. 6 directly controlling the gate of the output stage 304 and the gate of the bulk switch 307, instead of being routed via the driver circuitry 303 as shown in FIG. 3.

The passive protection circuit comprises a gate switch 602, coupled between the output node 108 and the gate of the output stage 304. The gate of the gate switch 602 is coupled to the supply voltage VDD, for example via the supply node 106.

During operation, when the supply voltage VDD is below the operating voltage of the driver circuitry 303 and the active protection circuitry 302, the voltage at the gate of the output stage 304 provided by the VDD is below the threshold voltage of the output stage 304. In such conditions, without the gate switch 602, the output stage 304 would switch on causing reverse current to flow through the output stage 304. However, with the gate switch 602 provided, when the load voltage VLOAD at the output node 108 exceeds the supply voltage VDD by more than the threshold voltage of the gate switch 602 such that $$VLOAD > VDD + Vt$$

the junction of the gate switch 602 nearest the output node is reverse biased causing the gate switch 602 to turn on and reverse current flow through the gate switch 602 to the gate of the output stage 304. As such, the voltage at the gate of the output stage 304 is driven from VDD to VLOAD. This ensures that the output stage 304 is switched off or remains switched off since the voltage at the gate of the output stage 304 is the same as the voltage at the output node 108. Thus, the gate switch 602 prevents current flowing between the output node 108 and the supply node 106 via the output stage 304.

The passive protection circuit 306 may further comprise a bulk gate switch 604 similar to the gate switch 602 described above for switching the gate of the bulk switch 307 to the output node 108 when a back-power condition is detected. The bulk gate switch 604 is coupled between the gate of the bulk switch 307 and the output node 108. The gate of the bulk gate switch 604 is connected to the supply voltage VDD, for example to the supply node 106.

During operation, when the load voltage VLOAD at the output node 106 exceeds the supply voltage VDD by more than the threshold voltage of the gate switch 602 such that $$VLOAD > VDD + Vt$$

the bulk gate switch 604 begins to conduct and reverse current flows from the output node 106 to the gate of the bulk switch 307 via the bulk gate switch 604. As such, the voltage at the gate of the bulk switch 307 is driven to VLOAD. This ensures that the bulk switch 307 is switched off or remains switched off since the gate voltage of the bulk switch 307 is the same as the voltage at the output node 108. Thus, the bulk gate switch 604 prevents current flowing between the output node 108 and the supply node 106 via the bulk switch 307.

Thus, the gate switch 602 and the optional bulk gate switch 604 provide a passive circuit arrangement with the ability to break any conductive path between the output node 108 and the supply node 106 in the event of a back-power condition. As noted previously, such a configuration is particularly useful in circumstances where the supply voltage VDD is below an operational threshold for operating active circuitry, such as the active protection circuit 302 and the driver circuitry 303.

In some embodiments, an output stage bulk switch 605 similar to the gate switch 602 and the bulk gate switch 604 described above may be provided for switching the bulk of the output stage 304 to the output node 108 when a back-power condition is detected. The output stage bulk switch 605 may operate in a similar manner to that described above with reference to the gate switch 602 and the bulk gate switch 604.

It will be appreciated that application of the load voltage VLOAD at the gate of the output stage 304, particularly when the load voltage VLOAD at the output node 108 is high (for example during a terminal fault), may cause issues and/or damage to other components coupled to the gate of the output stage 304. For example, one or more of the driver circuitry 303, the active protection circuit 302 and the supply node 106 (via the pullup resistor 305) may all be connected to the gate of the output stage 304 when the load voltage VLOAD is applied to the gate of the output stage 304 by the gate switch 602.

To address or ameliorate one or more of these problems, the passive protection circuit 306 may further comprise a gate isolation circuit 606 configured to isolate the driver circuitry 303 and/or the active protection circuit 302 from the gate of the output stage 304 in a back-power condition in which the supply voltage VDD is below an operation voltage of the driver circuitry 303 and/or the active protection circuit 302. FIG. 6 provides an example implementation of the gate isolation circuit 606. It will be appreciated that the present application is not limited to such implementations.

As shown in FIG. 6, the gate isolation circuit 606 is coupled between a control node 608 and the gate of the output stage 304. Driver circuitry 630 comprising a pair of drive switches 632, 634 may be coupled to the control node 608 and configured to drive the control node with either the supply voltage VDD or ground (or another reference voltage) in response to application of control voltages at the gates of the pair of drive switches 632, 634, for example by the driver circuitry 303 and/or the active protection circuit 302. Such driver circuitry is well known in the art and so will not be described in more detail here.

The gate isolation circuit 606 comprises a transmission gate 610 comprising an n-type MOSFET 612 and a p-type MOSFET 614 connected in parallel. In the example shown, the sources of the n- and p-type MOSFETs 612, 614 are coupled to the gate of the output stage and the drains of the n- and p-type MOSFETs 612, 614 are coupled to the control node 608. In other embodiments, the sources may be coupled to the control node 608 and the drains coupled to the gate of the output stage 304. The transmission gate further comprises an inverter 616 comprised of an additional MOSFET device, coupled between the gates of the n- and p-type MOSFETS 612, 614. The gate of the inverter 616 is coupled to the gate of the p-type MOSFET 614, the drain of the inverter 616 is coupled to the gate of the n-type MOSFET 612, and the source of the inverter 616 is coupled to a reference voltage (ground). The gate of the p-type MOSFET 614 is additionally coupled to a low reference voltage (ground) via a pulldown resistor 618 to pull the gate of the p-type MOSFET 614 low. Likewise, the gate of the n-type MOSFET 612 is coupled to a reference voltage (Vcasn) via a pullup resistor 622. The reference voltage Vcasn may be equal to VDD or a supply voltage generated from VDD to limit the gate-source voltage (Vgs) across the n-type MOSFET 612 when VDD is larger than the operating range of the n-type MOSFET 612. The gate of the p-type MOSFET 614 may optionally be coupled to gate of the inverter 616 via a second resistor 620. The second resistor 620 is provided to limit the voltage provided at the gate of the inverter 616 during a back-power event.

In a normal (non-back-power) operating mode, the pullup resistor 622 pulls the gate of the n-type MOSFET 612 high (to Vcasn) which turns the n-type MOSFET 612 on and the pulldown resistor 618 pulls the gate of the p-type MOSFET 614 low which turns the p-type MOSFET 614 on. In doing so, the transmission gate 610 shorts the gate of the output stage 304 to the control node 608.

During a back-power condition, the inverter 616 and the transmission gate switch 624 operate to turn off the transmission gate 610 thus breaking the connection between the gate of the output stage 304 and the control node 608. The transmission gate switch 624 operates in a similar manner to that described above with reference to the gate switch 602 and the bulk gate switch 604, pulling the gate of the inverter 616 to VLOAD, turning the p-type MOSFET 614 off and turning the inverter 616 on, which in turn pulls the gate of the n-type MOSFET 612 low to turn the n-type MOSFET 612 off. As a result, the transmission gate 610 is turned off, preventing back-power current from flowing from the gate of the output stage 304 to the control node 608.

To reduce the effect of leakage current between the gate of the output stage 304 and the supply node 106, for example via the pullup resistor 305, the passive protection circuit 306 may further comprise a drain switch 626 configured to drain any current applied to the supply node 106 to ground due to reverse current during a back-power condition. The drain switch 626 may be a MOSFET device coupled between a ground reference and the supply node via a drain resistor 628. The gate of the drain switch 626 may be coupled to the gate of the p-type MOSFET 614 so as to be triggered to switch on by the current flowing from the output node 108 through the transmission gate switch 624 during the above-described back-power condition. In other embodiments, the gate of the drain switch 626 could be coupled to the second gate switch 604.

In the embodiments described above, various elements including but not limited to the output stage 104, the output stage 304, the bulk switch 307, the switches 506, 508, the gate switch 602, and the bulk gate switch 604, are shown as p-type MOSFET devices. In other embodiments, any one or more of these elements may be implemented as one or more other types of transistors including, for example, an n-type MOSFET (NMOS) and/or BJT. In the embodiments described above, various elements including but not limited to the drain switch 626 are shown as n-type MOSFET devices. In other embodiments, any one or more of these elements may be implemented as one or more other types of transistors including, for example, a p-type MOSFET (NMOS) and/or BJT.

Embodiments of the above-described systems may be implemented in a host device, especially a portable and/or battery powered host device such as a mobile computing device for example a laptop or tablet computer, a wearable device, a games console, a remote control device, a home automation controller or a domestic appliance including a domestic temperature or lighting control system, a toy, a machine such as a robot, an audio player, a video player, or a mobile telephone for example a smartphone. There is further provided a host device incorporating the above-described system. There is further provided a control method for a system as described above.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Back-power prevention circuitry for preventing a back power condition in which current flows from a load into a power supply, the circuitry comprising:
    an output stage comprising:
        an input node configured to be coupled to the power supply; and
        an output node configured to be coupled to the load; and
        one or more control nodes for controlling a conduction path between the input node and the output node; and
        protection circuitry coupled to the one or more control nodes, the protection circuitry configured to control the one or more control nodes to break the conduction path between the input node and the output node to prevent back current flow from the load to the power supply in response to a load voltage at the output node exceeding a supply voltage at the input node, wherein the protection circuitry comprises:
            an active protection circuit configured to break the conduction path when the supply voltage exceeds an operational threshold of the active protection circuit; and
            a passive protection circuit configured to break the conduction path when the supply voltage is below the operational threshold of the active protection circuit.

2. Back-power prevention circuitry of claim 1, wherein the active protection circuit comprises:
    a current sensor configured to measure a current in the conduction path, wherein the active protection circuit is configured to control the one or more control nodes based on the measured current.

3. Back-power prevention circuitry of claim 2, further comprising a sense resistor in the conduction path, wherein the current sensor is configured to measure the current through the sense resistor.

4. Back-power prevention circuitry of claim 1, wherein the active protection circuit is configured to: compare the supply voltage to the load voltage; and
    control the one or more control nodes based on the comparison.

5. Back-power prevention circuitry of claim 2, wherein controlling the one or more control nodes comprises controlling a gate of the output stage.

6. Back-power prevention circuitry of claim 5, wherein the active protection circuit is configured to control the gate of the output stage when the load voltage exceeds the supply voltage.

7. Back-power prevention circuitry of claim 6, the active protection circuit is configured to apply the load voltage at the gate of the output stage when the load voltage exceeds the supply voltage.

8. Back-power prevention circuitry of claim 2, wherein controlling the one or more control nodes comprises controlling a bulk connection between the bulk of the output stage and the input node.

9. Back-power prevention circuitry of claim 8, further comprising:
    a bulk switch coupled between the bulk of the output stage and the input node,
    wherein controlling the one or more control nodes comprises driving a gate of the bulk switch to control the bulk connection between the bulk of the output stage and the input node.

10. Back-power prevention circuitry of claim 8, wherein controlling the bulk connection between the bulk of the output stage and the input node comprises:
    connecting the bulk of the output stage to the input node when the supply voltage exceeds the load voltage; and
    disconnecting the bulk of the output stage to the input node when the load voltage exceeds the supply voltage.

11. Back-power prevention circuitry of claim 10, wherein controlling the bulk connection between the bulk of the output stage and the input node further comprises:
    connecting the bulk of the output stage to the output node when the load voltage exceeds the supply voltage.

12. Back-power prevention circuitry of claim 1, wherein the passive protection circuit is configured to apply the load voltage to one or more of the one or more control node when the load voltage at the output node exceeds a supply voltage at the input node.

13. Back-power prevention circuitry of claim 12, wherein the passive protection circuit comprises a first gate switch coupled between the control node and the output node, the first gate switch configured to be on when a load voltage at the output node exceeds a supply voltage at the input node by more than a threshold voltage of the first gate switch.

14. Back-power prevention circuitry of claim 12, further comprising:
    a bulk switch coupled between the bulk of the output stage and the input node, wherein the passive protection circuitry is configured to apply the load voltage to the gate of the bulk switch when the load voltage at the output node exceeds a supply voltage at the input node.

15. Back-power prevention circuitry of claim 14, wherein the passive protection circuit further comprises:
    a bulk gate switch coupled between a gate of bulk switch and the output node, the bulk gate switch configured to be on when a load voltage at the output node exceeds a supply voltage at the input node by more than a threshold voltage of the first gate switch.

16. Back-power prevention circuitry of claim 1, further comprising gate isolation circuitry configured to disconnect the one or more control nodes of the output stage.

17. Back-power prevention circuitry of claim 16, wherein the gate isolation circuitry comprises:
- a transmission gate coupled between a gate of the output stage and one or more of the one or more control nodes, the transmission gate having a gate; and
- a transmission gate switch coupled between the gate of the transmission gate and the output node, the transmission gate switch configured to turn the transmission gate off when the load voltage exceeds the supply voltage by more than a threshold voltage of the transmission gate switch.

18. Back-power prevention circuitry of claim 1, wherein the protection circuitry further comprises current drain circuitry configured to couple the input node to ground when the load voltage exceeds the supply voltage.

19. Back-power prevention circuitry of claim 1, wherein the output stage comprises a power MOSFET device for controlling the conduction path between the input node and the output node.

20. Back-power prevention circuitry of claim 1, wherein the output stage comprises first and second power MOSFET devices having a common source, wherein a first drain of the first power MOSFET is coupled to the input node, a second drain of the second power MOSFET is coupled to the output node, and first and second gates of the first and second power MOSFETs are coupled to a common one of the one or more control nodes.

21. Back-power prevention circuitry of claim 1, wherein the load comprises a light emitting diode, LED.

22. An integrated circuit comprising back-power prevention circuitry according to claim 1.

* * * * *